(12) United States Patent
Lin

(10) Patent No.: US 7,409,983 B2
(45) Date of Patent: Aug. 12, 2008

(54) HEAT DISSIPATING APPARATUS

(75) Inventor: Tong-Hua Lin, Guangdong (CN)

(73) Assignees: Fu Zhun Precision Industry (Shen Zhen) Co., Ltd., Longhua, Bao'an District, Shenzhen, Guangdong (CN); Foxcomm Technology Co., Ltd., Tu-Cheng, Taipei Hsien (TW)

( * ) Notice: Subject to any disclaimer, the term of this patent is extended or adjusted under 35 U.S.C. 154(b) by 319 days.

(21) Appl. No.: 11/164,327

(22) Filed: Nov. 18, 2005

(65) Prior Publication Data

US 2006/0219392 A1    Oct. 5, 2006

(30) Foreign Application Priority Data

Apr. 1, 2005    (TW) .............................. 94110519 A

(51) Int. Cl.
*H05K 7/20* (2006.01)

(52) U.S. Cl. .................. 165/80.3; 361/704; 165/104.33

(58) Field of Classification Search ............ 165/104.33, 165/151, 182
See application file for complete search history.

(56) References Cited

U.S. PATENT DOCUMENTS

| | | | | |
|---|---|---|---|---|
| 1,805,116 A | * | 5/1931 | Trane ........................... | 165/68 |
| 1,907,036 A | * | 5/1933 | Belleau ....................... | 165/164 |
| 2,948,515 A | * | 8/1960 | Mehalick et al. ............ | 165/122 |
| 4,884,631 A | | 12/1989 | Rippel | |
| 6,382,307 B1 | * | 5/2002 | Wang et al. ................. | 165/80.3 |
| 6,741,468 B2 | * | 5/2004 | Jing et al. .................... | 361/700 |
| 6,785,140 B2 | * | 8/2004 | Artman et al. .............. | 361/709 |
| 6,953,081 B2 | * | 10/2005 | Klingler et al. ............... | 165/43 |
| 7,025,122 B2 | * | 4/2006 | You-Tien .................... | 165/80.3 |
| 7,121,333 B2 | * | 10/2006 | Wang ........................... | 165/182 |
| 7,128,131 B2 | * | 10/2006 | Kubo .......................... | 165/80.3 |
| 7,284,597 B2 | * | 10/2007 | Tang .......................... | 165/80.3 |
| 2007/0011877 A1 | * | 1/2007 | Chen et al. ............. | 29/890.046 |

\* cited by examiner

*Primary Examiner*—Allen J Flanigan
(74) *Attorney, Agent, or Firm*—Winston Hsu

(57) ABSTRACT

A heat dissipating apparatus (10) includes a plurality of fins (20) stacked together along a predetermined direction, and a plurality of projection members (23) extending from each fin. Each of the fins includes a main body (22). The main bodies of two adjacent fins define an air passage (29) therebetween. The projection members of a first fin abut against the main body of a second fin, for dividing the air passage into a plurality of small air channels.

10 Claims, 7 Drawing Sheets

HEAT DISSIPATING APPARATUS

DESCRIPTION

1. Field of the Invention

The present invention relates generally to a heat dissipating apparatus, and particularly to a heat dissipating apparatus for a heat generating electronic component.

2. Description of Related Art

Developments in electronic technology have resulted in many heat dissipating problems. A heat dissipating apparatuses is often attached on a heat-generating electronic component to efficiently remove the heat generated by the component.

Conventionally, a heat dissipating apparatus includes a heat sink with a plurality of fins, and a fan for providing airflows passing through the fins. The fins are parallel to and space a predetermined distance with each other. An air passage is formed between two adjacent fins of the heat sink. The airflows pass through the air passages to exchange heat with the fins of the heat sink. The heat is absorbed from the heat-generating component. Then the heat is dissipated to surrounding environment. Thus, heat dissipation of the heat-generating component is accomplished.

In this heat dissipating apparatus, heat-dissipating areas of the heat sink need to be increased to enhance the heat dissipation effect of the heat dissipating apparatus. One way to increase the heat-dissipating areas of the heat sink is to reduce the spacing distance of the adjacent fins. This will increase the weight of the heat sink, which is disadvantageous in view of lightweight requirement of electronic products. Another way is to increase the size of each of the fins. This will increase the size of the heat sink, which is disadvantageous in view of compact requirement of the electronic products. Thus, how to increase the heat dissipating capability of a heat dissipating apparatus without increasing its size and weight becomes an issue.

SUMMARY OF THE INVENTION

The present invention relates to a heat dissipating apparatus. According to a preferred embodiment of the present invention, the heat dissipating apparatus includes a plurality of fins stacked together along a predetermined direction, and a plurality of projection members extending from each fin. Each of the fins includes a main body. The main bodies of two adjacent fins define an air passage therebetween. The projection members of a first fin abut against the main body of a second fin, for dividing the air passage into a plurality of small air channels whereby airflows can more smoothly and quickly flow through the fins to effectively take heat away therefrom.

Other advantages and novel features of the present invention will become more apparent from the following detailed description of preferred embodiment when taken in conjunction with the accompanying drawings, in which:

DETAILED DESCRIPTION

Referring to FIGS. 1 to 4, a heat dissipating apparatus 10 according to a preferred embodiment of the present invention includes a plurality of fins 20 stacked together. The fins 20 define a plurality of through holes 21 therein for receiving a plurality of heat pipes 30.

Figure 1:
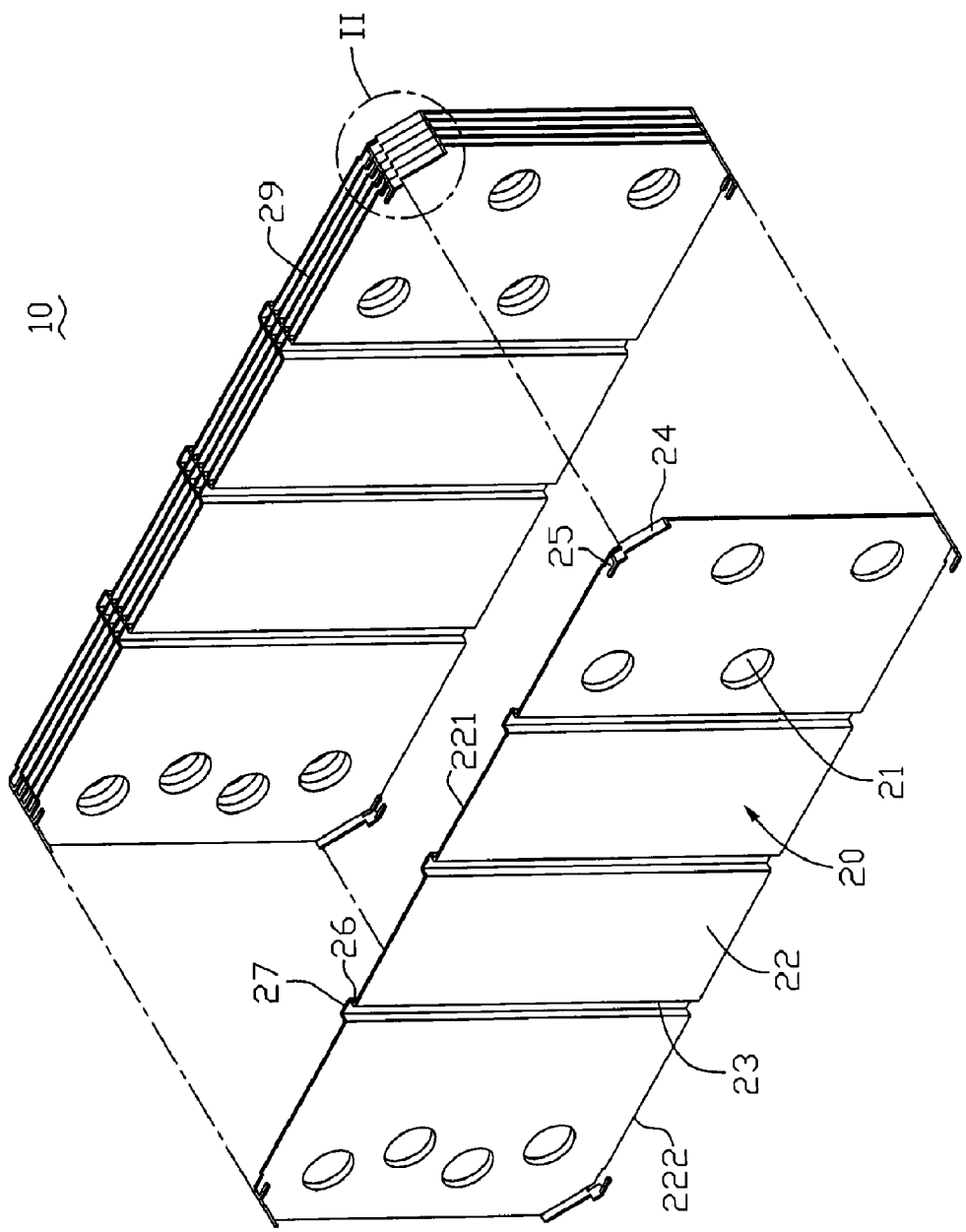
FIG. 1 is an isometric view of a fin assembly according to a preferred embodiment of the present invention.
Figure 2:
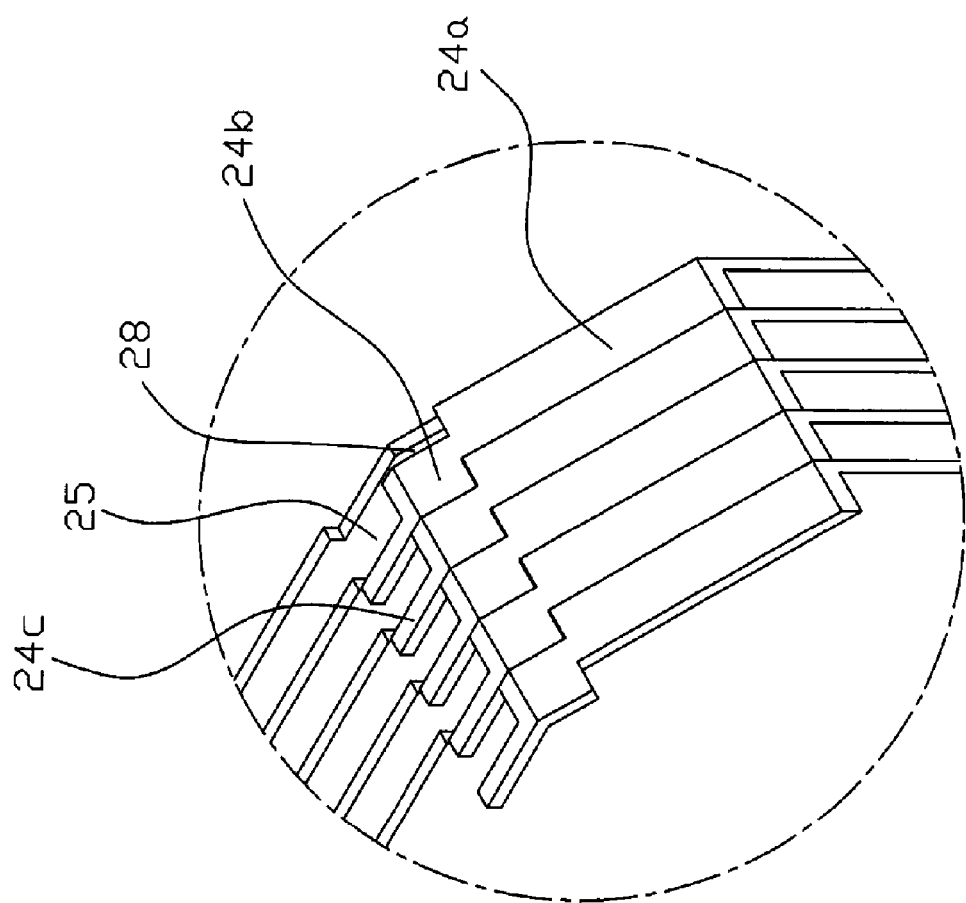
FIG. 2 is an enlarged view of a circled portion of FIG. 1 indicated by II.

Referring to FIGS. 1 and 2, each of the fins 20 includes a rectangular main body 22. The main body 22 includes a plurality of projection members such as ribs 23 extending from one side of the main body 22, four locking members 24 extending from four corners of the main body 22, and four cutouts 25 corresponding to the locking members 24, respectively.

Each of the ribs 23 is formed by pressing the main body 22 to form an indentation with a "U"-shaped cross section on the main body 22. Each of the ribs 23 includes two sidewalls 26 extending from the main body 22, and a base wall 27 integrally connecting with the sidewalls 26. Alternatively, the cross section of each of the ribs 23 may be triangle-shaped, or hemicycle-shaped.

Each of the locking members 24 includes an abutting plate 24a perpendicular to the main body 22, a flange 24b extending from one end of the abutting plate 24a, and a finger 24c extending from a free end of the flange 24b. A longitudinal extension direction of the abutting plate 24a forms a sharp angle with a top/bottom side 221/222 of the main body 22. The flange 24b extends along the longitudinal extension direction of the abutting plate 24a and offsets from the abutting plate 24a along a lateral direction of the abutting plate 24a. A slot 28 is defined between the flange 24b and the main body 22 of the fin 20. A part of the flange 24b extends beyond a free lateral edge of the abutting plate 24a. The cutout 25 is defined between the finger 24c of the locking member 24 and the main body 22.

Figure 3:
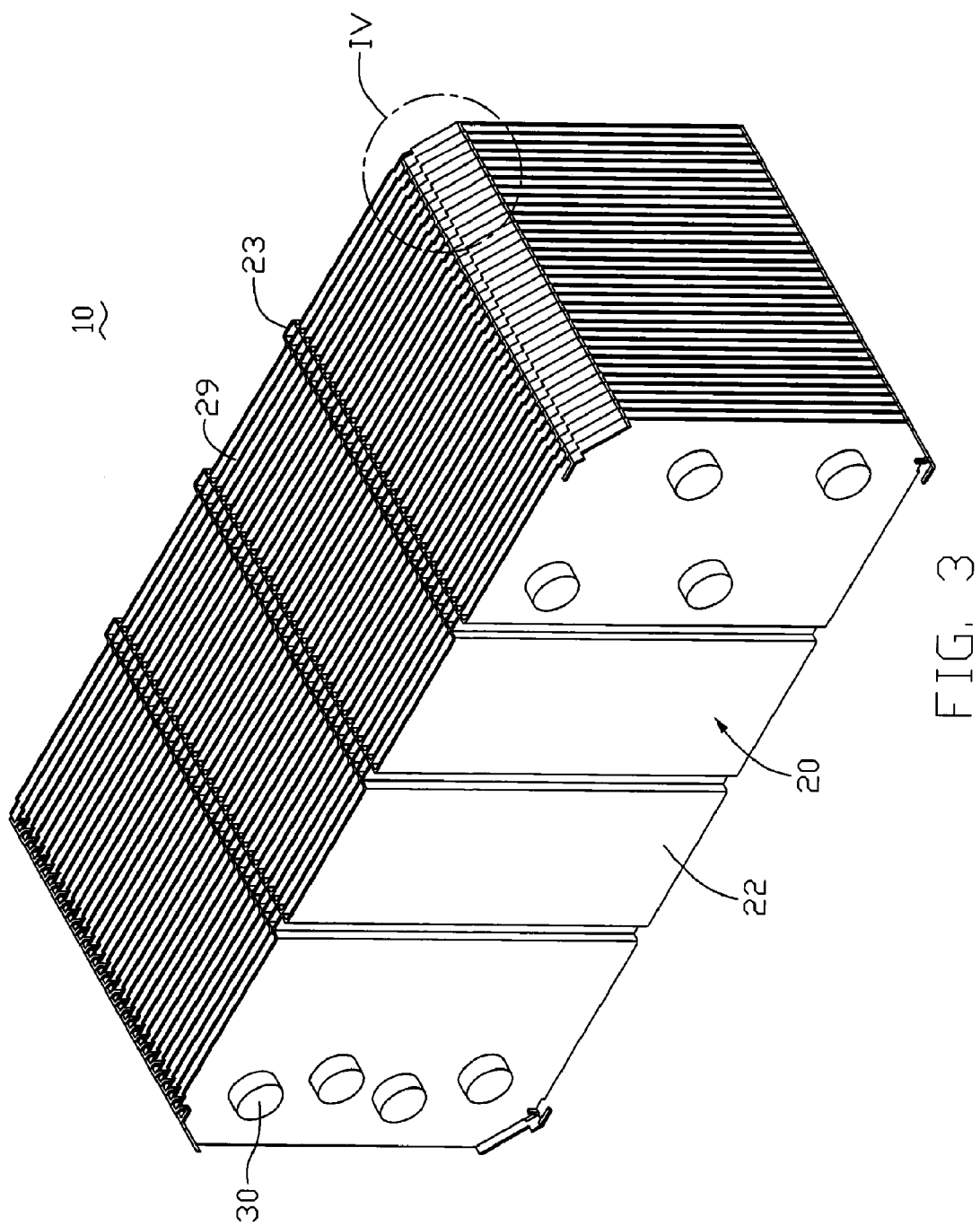
FIG. 3 is an assembled view of a heat dissipating apparatus constructed with the fin assembly of FIG. 1.
Figure 4:
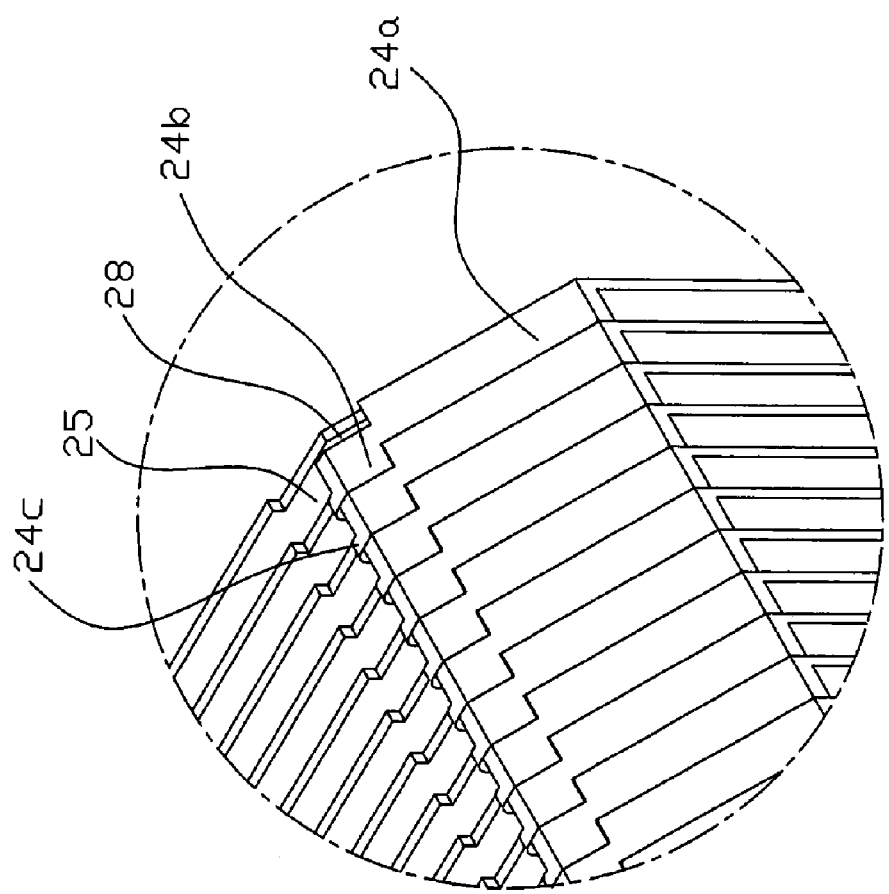
FIG. 4 is an enlarged view of a circled portion of FIG. 3 indicated by IV.

Referring to FIGS. 3 and 4, in assembly of the heat dissipating apparatus 10, a first fin 20 is held in a vertical direction, and a second fin 20 is placed parallel to the first fin 20, with the ribs 23 of the second fin 20 abutting against the sidewalls 26 of the ribs 23 of the first fin 20. In such position, the free lateral edges of the abutting plates 24a of the first fin 20 abut against the main body 22 of the second fin 20, thereby defining an air passage 29 between the first fin 20 and the second fin 20. The flanges 24b of the first fin 20 are received in the slots 28 of the second fin 20, with a lateral edge of each flange 24b of the first fin 20 abutting against an opposite lateral edge of each flange 24b of the second fin 20. The fingers 24c of the first fin 20 extend through the cutouts 25 of the second fin 20, with a front side of each finger 24c of the first fin 20 aligning with a rear side of the main body 22 of the second fin 20. Then, other fins 20 are sequentially mounted to the second fin 20 in a similar fashion, for stacking the fins 20 in a group. The fingers 24c of each of the fins 20 are bent to a position that the fingers 24c of the fins 20 engage the main bodies 22 of corresponding neighboring fins 20. Thus, the fins 20 are connected together to form a fin assembly. Finally, the heat pipes 30 extend through the through holes 21 of the fins 20 and are soldered thereto thereby completing the assembly of the heat dissipating apparatus 10.

In this heat dissipating apparatus 10, the ribs 23 increase heat exchanging areas between the fins 20 and airflows flowing through the air passages 29, thereby increasing the heat dissipation effect of the heat dissipating apparatus 10. The ribs 23 of each of the fins 20 abut against the sidewalls 26 of the ribs 23 of a front fin 20. The interconnected ribs 23 divide the air passages 29 into four fluidically independent air channels (not labeled) through the fin assembly. These air channels are separated from each other. Thus, the airflows passing through the air channels are isolated from each other, thereby preventing turbulence from occurring in the fin assembly. Thus, the airflows can quickly and smoothly flow through the fin assembly to effectively take heat thereaway. This can also increase heat dissipation effect of the heat dissipating apparatus 10.

Figure 5:
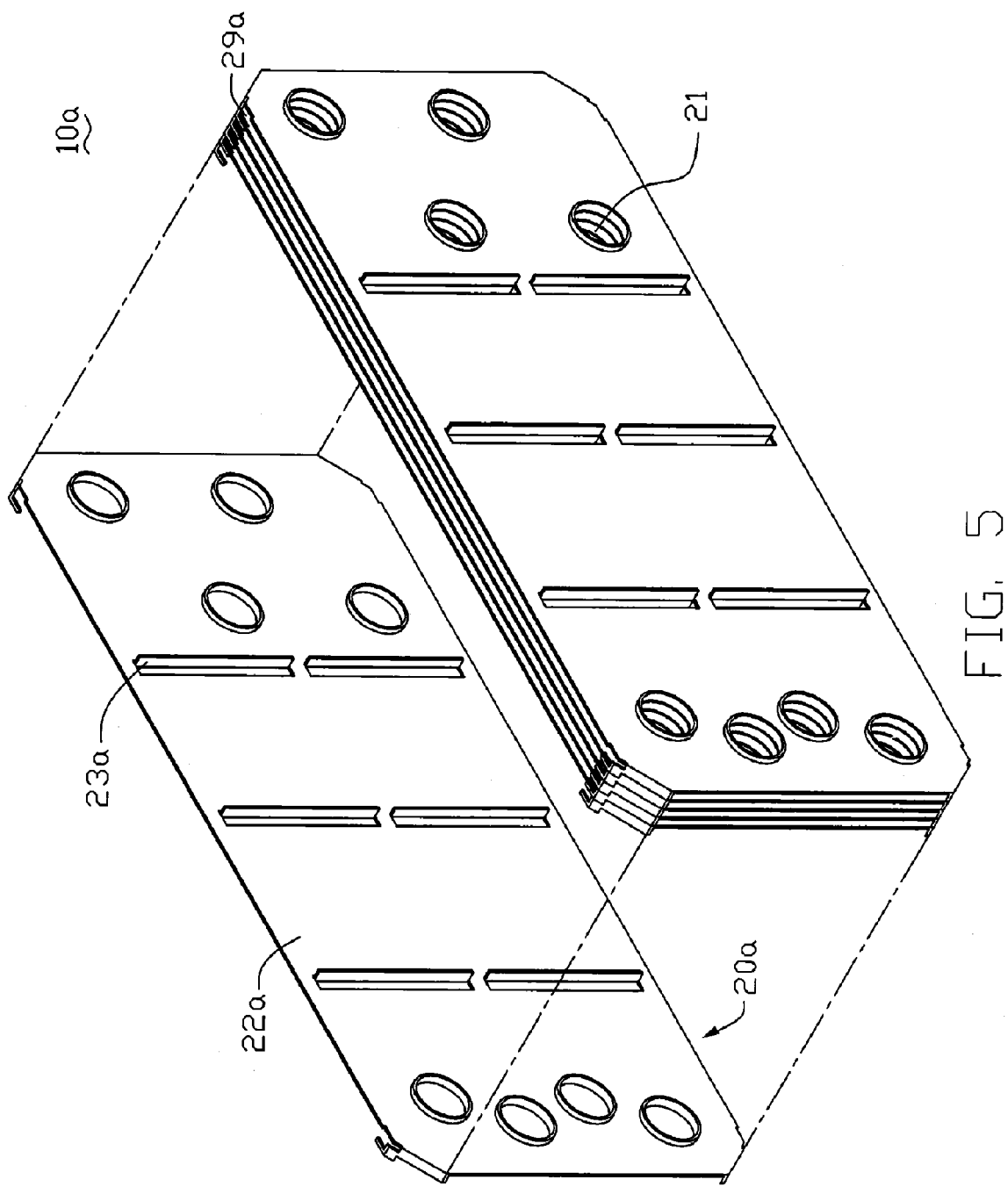
FIG. 5 is an isometric view of a fin assembly according to another embodiment of the present invention.
Figure 6:
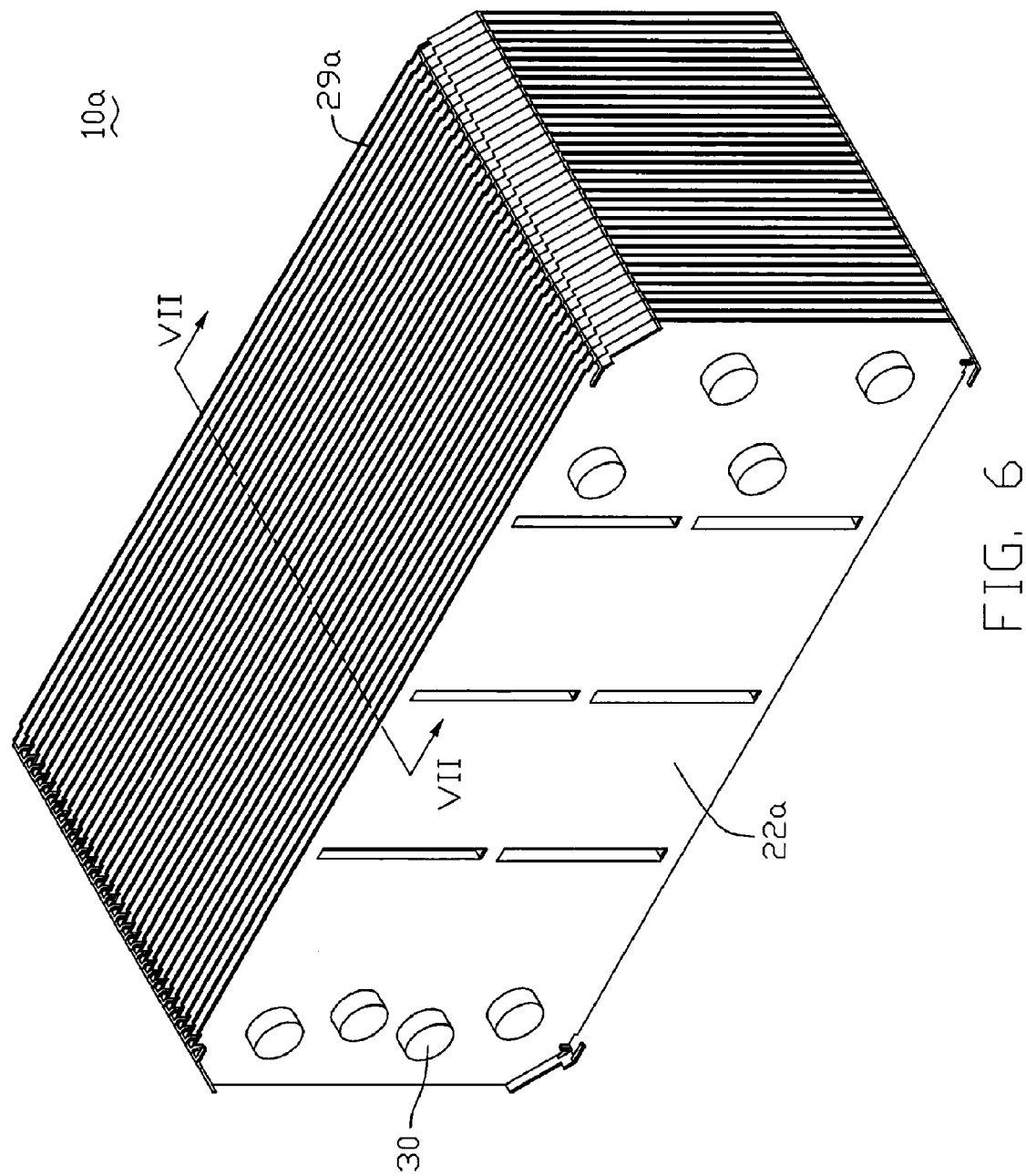
FIG. 6 is an assembled view of a heat dissipating apparatus constructed with the fin assembly of FIG. 5.
Figure 7:
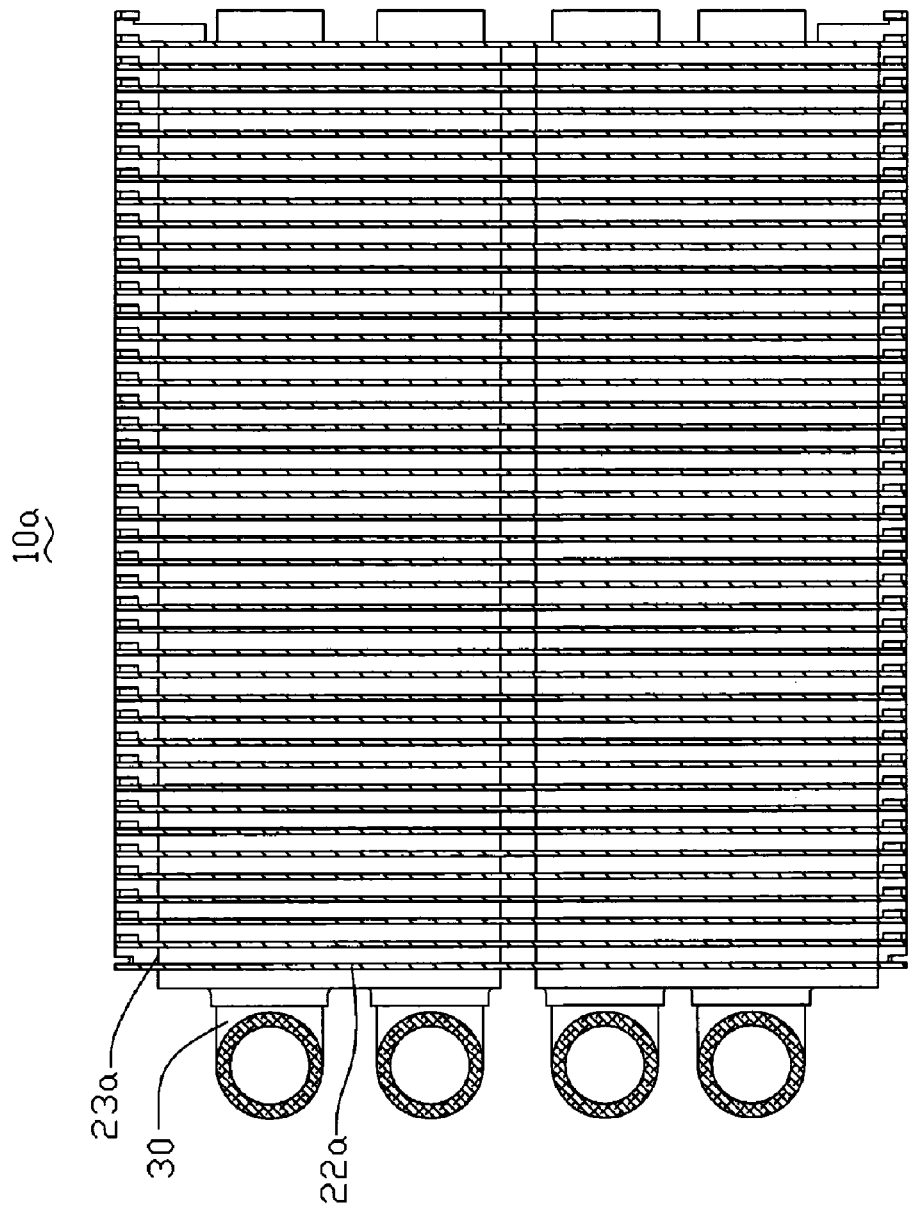
FIG. 7 is a cross sectional view take along line VII-VII of FIG. 6.

Referring to FIGS. 5 to 7, a heat dissipating apparatus 10a according to a second embodiment of the present invention is shown. In this embodiment, the projection members of each fin 20a are a plurality of air spacing plates 23a arrayed on the main body 22a. The air spacing plate 23a is formed by stamping. The air spacing plate 23a is perpendicularly projected toward one side of the main body 22a of the fin 20a. The air spacing plates 23a increase heat-dissipating areas of the heat dissipating apparatus 10a, and divide each of the air passages 29a into a plurality of small air channels, to increase the heat dissipation effect of the heat dissipating apparatus 10a.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fin assembly comprising:
 a plurality of fins stacked together along a predetermined direction, each of the fins comprising a main body, the main bodies of two adjacent fins defining an air passage therebetween; and
 a plurality of projection members extending from each fin, the projection members of a first fin abutting against the main body of a second fin, for dividing the air passage into a plurality of small air channels;
 wherein the first fin is coupled with the second fin via a plurality of locking members;
 wherein the locking members comprise fingers, respectively, the main body defines a plurality of cutouts between the fingers and the main body, respectively, the fingers of the first fin extend through the cutouts of the main body of the second fin, and engage the main body of the second fin; and
 wherein the locking member further comprises an abutting plate extending from the main body, and a flange extending from one end of the abutting plate, the finger offsets from a free edge of the flange.

2. The fin assembly as described in claim 1, wherein the projection members are a plurality of air spacing plates extending from the main body.

3. The fin assembly as described in claim 2, wherein the air spacing plates are perpendicularly extended toward one side of the main body.

4. The fin assembly as described in claim 1, wherein the projection members are a plurality of ribs extending from one side of the main body.

5. The fin assembly as described in claim 4, wherein the cross section of each of the ribs is one of "U"-shaped, triangle-shaped and hemicycle-shaped.

6. The fin assembly as described in claim 4, wherein each of the ribs comprises two sidewalls extending from the main body.

7. The fin assembly as described in claim 1, further comprising a plurality of heat pipes extending through the fins.

8. A fin assembly comprising:
 a plurality of fins, each of the fins comprising a locking member, the locking member being configured for clasping a first fin and a second fin adjacent the first fin to make the fins stacked together;
 a plurality of air passages formed between the fins, and
 at least a projection member positioned in each of the air passages for dividing the air passage into a plurality of small air channels;
 wherein the locking member comprises a finger, the fingers of the first fin engage a main body of the second fin; and
 wherein the locking member further comprises an abutting plate extending from the main body, and a flange extending from one end of the abutting plate, the finger offsets from a free edge of the flange.

9. The fin assembly as described in claim 8, wherein each of the fins comprises a main body, the projection members are a plurality of air spacing plate extending from the main body.

10. The fin assembly as described in claim 8, wherein each of the fins comprises a main body, the projection members are a plurality of ribs extending from one side of the main body.

* * * * *